US011076492B2

(12) United States Patent
Iketani et al.

(10) Patent No.: US 11,076,492 B2
(45) Date of Patent: Jul. 27, 2021

(54) THREE DIMENSIONAL CIRCUIT FORMATION

(71) Applicant: AVERATEK CORPORATION, Santa Clara, CA (US)

(72) Inventors: Shinichi Iketani, Sunnyvale, CA (US); Michael Riley Vinson, Sunnyvale, CA (US); Haris Basit, San Jose, CA (US)

(73) Assignee: Averatek Corporation, Santa Clara, CA (US)

( * ) Notice: Subject to any disclaimer, the term of this patent is extended or adjusted under 35 U.S.C. 154(b) by 0 days.

(21) Appl. No.: 16/717,719

(22) Filed: Dec. 17, 2019

(65) Prior Publication Data

US 2020/0196456 A1 Jun. 18, 2020

Related U.S. Application Data

(60) Provisional application No. 62/780,842, filed on Dec. 17, 2018.

(51) Int. Cl.
| | |
|---|---|
| *H05K 3/40* | (2006.01) |
| *H05K 1/11* | (2006.01) |
| *H05K 1/02* | (2006.01) |
| *H05K 3/00* | (2006.01) |

(52) U.S. Cl.
CPC ......... *H05K 3/4046* (2013.01); *H05K 1/0256* (2013.01); *H05K 1/115* (2013.01); *H05K 3/0094* (2013.01)

(58) Field of Classification Search
CPC ...... H05K 3/40; H05K 3/4046; H05K 3/0094; H05K 1/0256; H05K 1/115
USPC ....................................................... 174/250
See application file for complete search history.

(56) References Cited

U.S. PATENT DOCUMENTS

| | | |
|---|---|---|
| 5,298,687 A | 3/1994 | Rapoport |
| 5,352,923 A | 10/1994 | Boyd et al. |
| 6,132,586 A | 10/2000 | Adams et al. |
| 6,426,470 B1 | 7/2002 | Farquhar et al. |
| 6,723,600 B2 | 4/2004 | Wong et al. |
| 7,741,188 B2 | 6/2010 | Dyer et al. |
| 8,667,675 B2 | 3/2014 | Dudnikov, Jr. |
| 9,603,255 B2 | 3/2017 | Tourne |
| 2009/0023011 A1 | 1/2009 | Chaffins |
| 2015/0007933 A1* | 1/2015 | Iketani ................. H05K 3/429 156/247 |
| 2017/0339788 A1 | 11/2017 | Zeng |
| 2018/0295718 A1 | 10/2018 | Uzoh |
| 2018/0317327 A1* | 11/2018 | Iketani ................. H05K 3/429 |

OTHER PUBLICATIONS

International search report dated Apr. 17, 2020, for related PCT application No. PCT/US2019/066891. 12 pages.

* cited by examiner

*Primary Examiner* — Tremesha S Willis
(74) *Attorney, Agent, or Firm* — Fish IP Law, LLP

(57) ABSTRACT

Devices, methods, and systems for forming an electrical circuit out of a conductor embedded in two layers of substrate are disclosed. Portions of the two layers of substrate and the conductor are removed, forming a cavity through the two layers and the conductor. A blocker material is deposited along the wall of the cavity. A portion of the blocker material and adjacent layer of the substrate is removed forming another cavity in contact with a part of the conductor. A surface of the second cavity is then electroless plated by a conductive metal to form part of the electrical circuit.

14 Claims, 14 Drawing Sheets

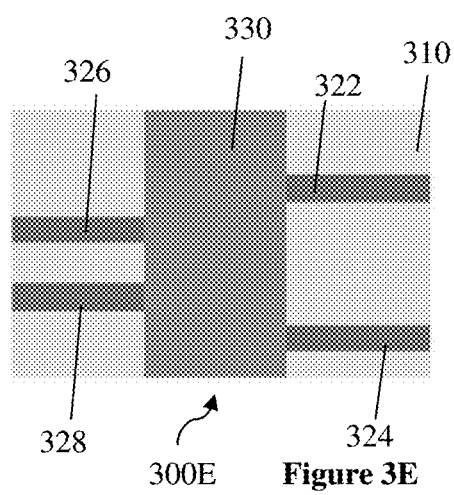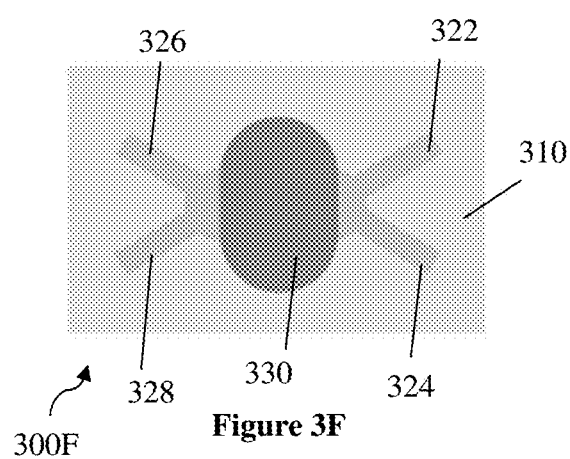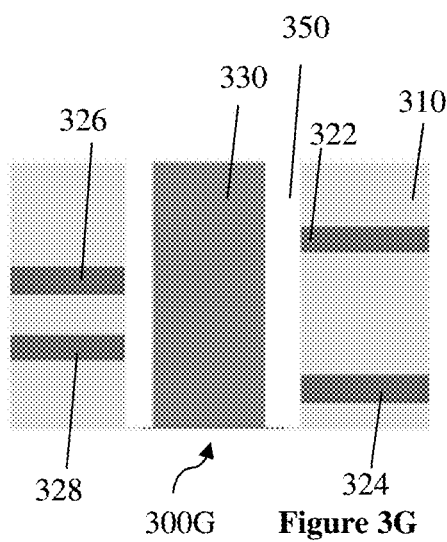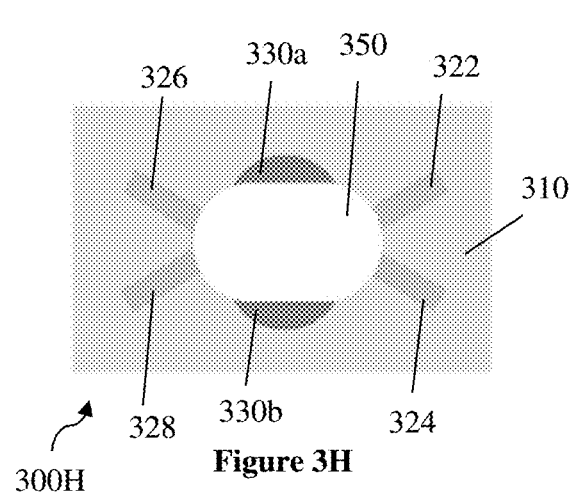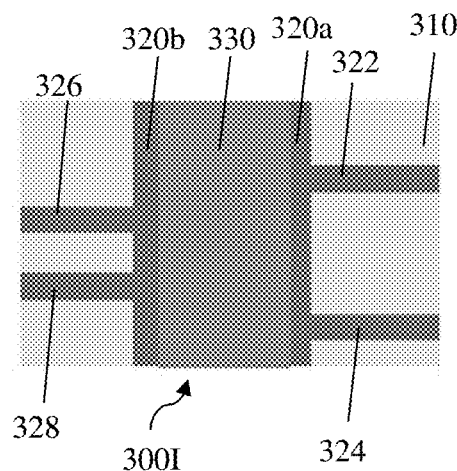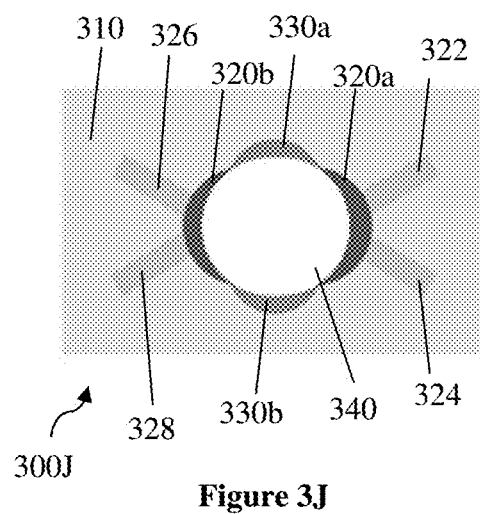

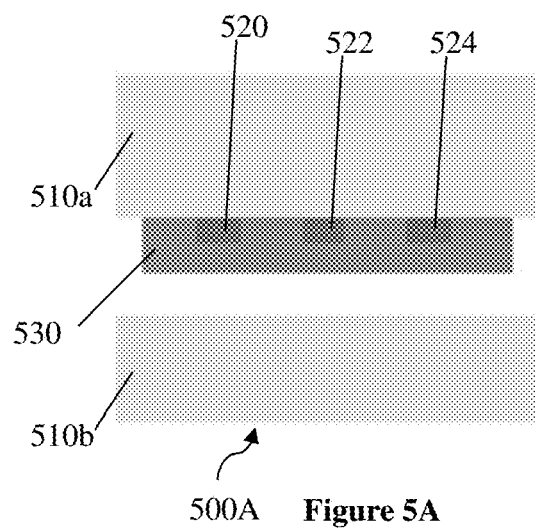
500A  Figure 5A
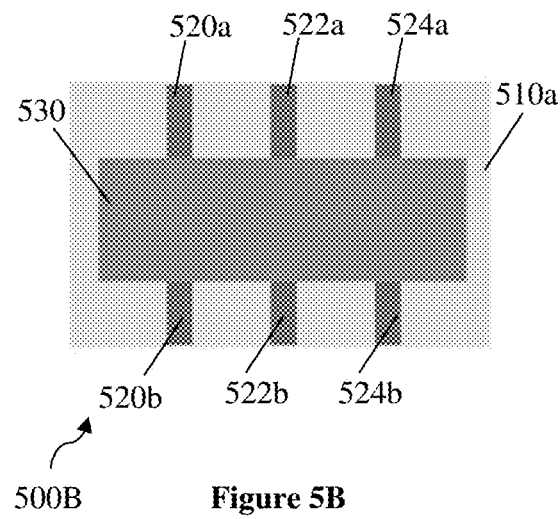
500B  Figure 5B
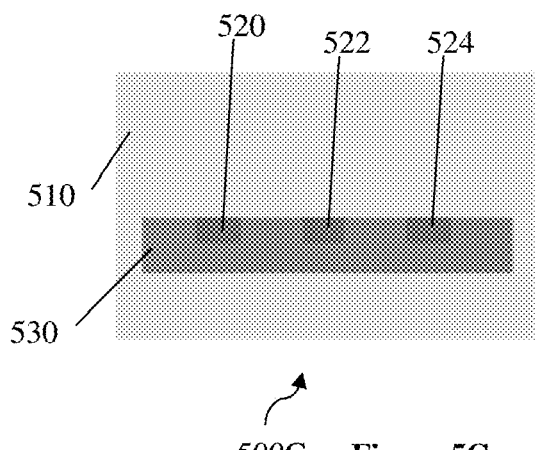
500C  Figure 5C
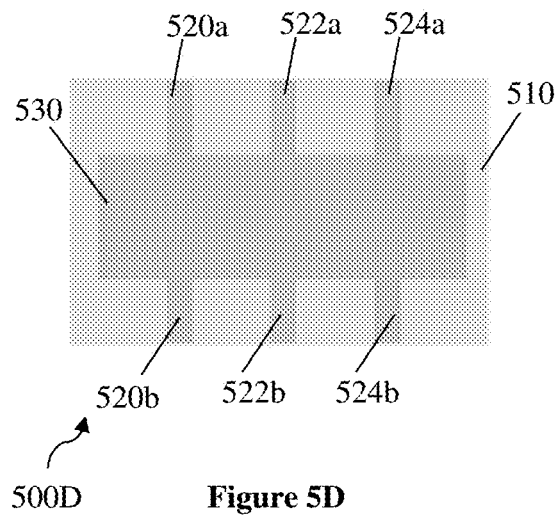
500D  Figure 5D

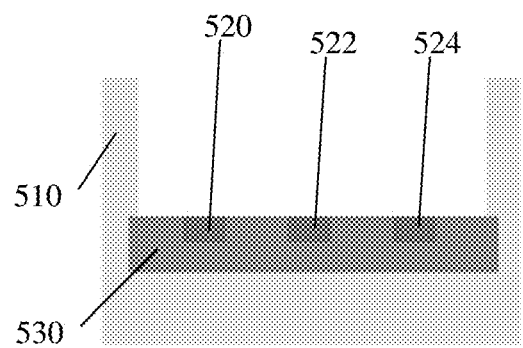
500E Figure 5E
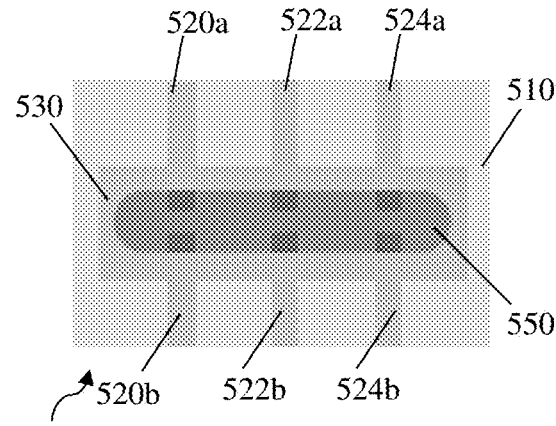
500F Figure 5F
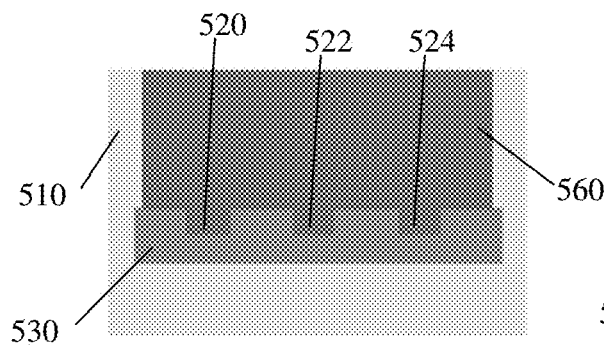
500G Figure 5G
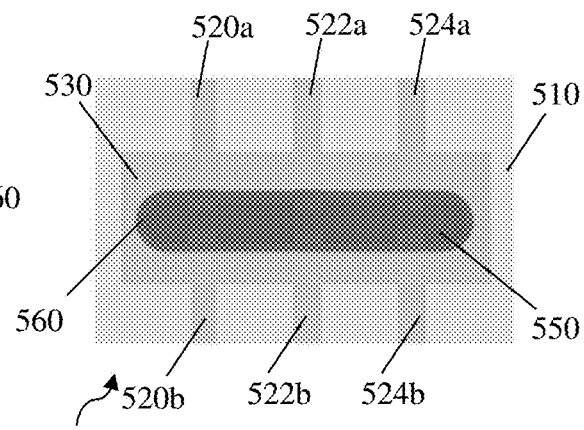
500H Figure 5H
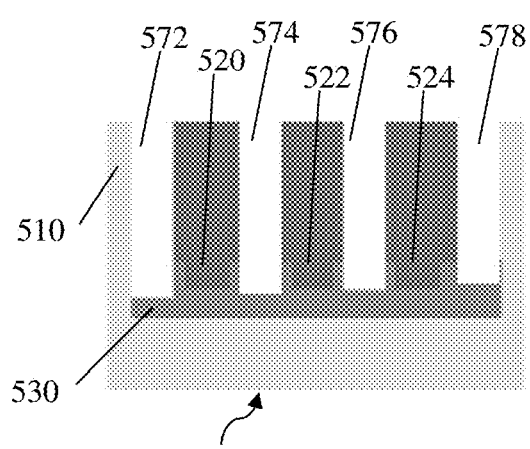
500I Figure 5I
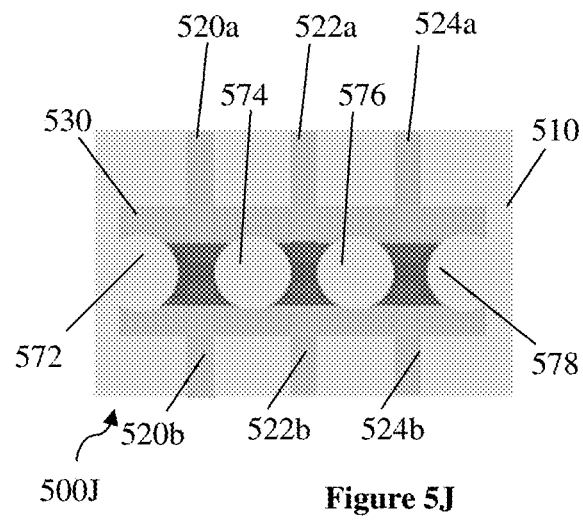
500J Figure 5J

600E

600F

600G

600H

600I

600J

THREE DIMENSIONAL CIRCUIT FORMATION

This application claims the benefit of U.S. Provisional Patent No. 62/780,842, filed Dec. 17, 2018, which is incorporated by reference in its entirety herein.

FIELD OF THE INVENTION

The field of the invention relates to methods and systems for separating electrical circuit on a substrate.

BACKGROUND

The following description includes information that may be useful in understanding the present invention. It is not an admission that any of the information provided herein is prior art or relevant to the presently claimed invention, or that any publication specifically or implicitly referenced is prior art.

Electroless metal deposition uses a redox reaction to deposit a layer of metals on a substrate without passage of an electric current. In this process, several types of metals can be used as catalysts for deposition of the metals. For example, palladium, platinum, silver are well known catalysts for initiating electroless metal deposition on substrates. The catalysts facilitate initiation and subsequent deposition of electroless metals (e.g., copper, tin, etc.) from solutions of metal salts. The catalysts can be generated and deposited on a substrate in various forms (e.g., Palladium can be deposited as colloidal palladium, ionic palladium, etc.).

However, the electroless metal plating can be prohibited when the surface is covered by a plating blocker material. Therefore, the plating blocker material can be used to protect areas which should not be metal plated and also can be used to separate a conductor layer from another conductor layer, with the metal plating blocker between them.

U.S. Pat. No. 5,353,923 to Boyd discloses a separation of an electrical conductor using mechanical trench. Although this method is the easiest way to separate the electrical conductor, the mechanical trench may cause damage on the metal deposited close to the trench. All publications identified herein are incorporated by reference to the same extent as if each individual publication or patent application were specifically and individually indicated to be incorporated by reference. Where a definition or use of a term in an incorporated reference is inconsistent or contrary to the definition of that term provided herein, the definition of that term provided herein applies and the definition of that term in the reference does not apply.

U.S. Pat. No. 6,723,600 to Wong discloses a separation of an electrical conductor using photoresist material. In this method, the photoresist coats on a negative electrical circuit pattern, followed by metal deposition on a substrate. The metal is deposited only on the area which is not covered by the photoresist. Consequently, the photoresist can separate the metal deposition by presenting the photoresist in between the metal deposition. Finally, laser irradiation is applied onto the photoresist to remove it. Therefore, photoresist was physically applied on and removed from the substrate.

Thus, there is still a need for improved methods and systems for separating conductive layers on a substrate by way of chemically active plating blocker material.

SUMMARY OF THE INVENTION

The inventive subject matter provides apparatus, systems and methods for chemically separating electric conducting layers on a substrate. Preferred embodiments of this method include a step of embedding a first conductor layer (e.g., conductive metal) in a substrate. Viewed from another perspective, a conductor layer is embedded in a substrate, such that first and second layers of the substrate are on either side (e.g., above and below) of the conductor layer. The first conductor layer is selected from or at least partially includes at least one of palladium, platinum, silver, copper, and gold. The substrate includes at least one of a polyimide, a cloth, a plastic, a metal, a ceramic, and a resin. However, in some embodiments a substrate with an embedded conductor layer is provided for processing.

At least part of the two substrate layers and the conductor layer are removed to form a cavity, for example by mechanically drilling or forming a trench through the layers. In some embodiments, the trench or cavity is formed in a negative circuit pattern using one of UV, $CO_2$, YAG, excimer laser, or mechanical trimmer, or milling. The cavity or trench is then coated with a blocker material (e.g., metal plating blocker, metal plating resist, etc), selected from at least one of a photoimageable or non-photoimageable polymer film, wax, an oligomer, or a hardmask.

The method further includes a step of ablating part of the plating blocker and a portion of the substrate layer about (e.g., proximal to) the plating blocker, typically removing material until the conductor layer is exposed. The ablation can be performed by use of UV, $CO_2$, YAG, excimer laser, mechanical trimmer, or other appropriate means. Electroless plating is then used to plate a second conductor (e.g., metal) on the substrate surface and the exposed surface of the conductor layer, with the remaining plating blocker preventing plating to those areas. The second conductor is generally selected from copper, nickel, tin, silver, gold, aluminum, lithium, palladium, platinum, rhodium, or corresponding alloys.

Various objects, features, aspects and advantages of the inventive subject matter will become more apparent from the following detailed description of preferred embodiments, along with the accompanying drawing figures in which like numerals represent like components.

BRIEF DESCRIPTION OF THE DRAWINGS

FIGS. 3A through 3J depict side cross sections and top down views of an electrical circuit of the inventive subject matter.

FIGS. 5A through 5J depict side cross sections and top down views of yet another electrical circuit of the inventive subject matter.

DETAILED DESCRIPTION

Figure 1:
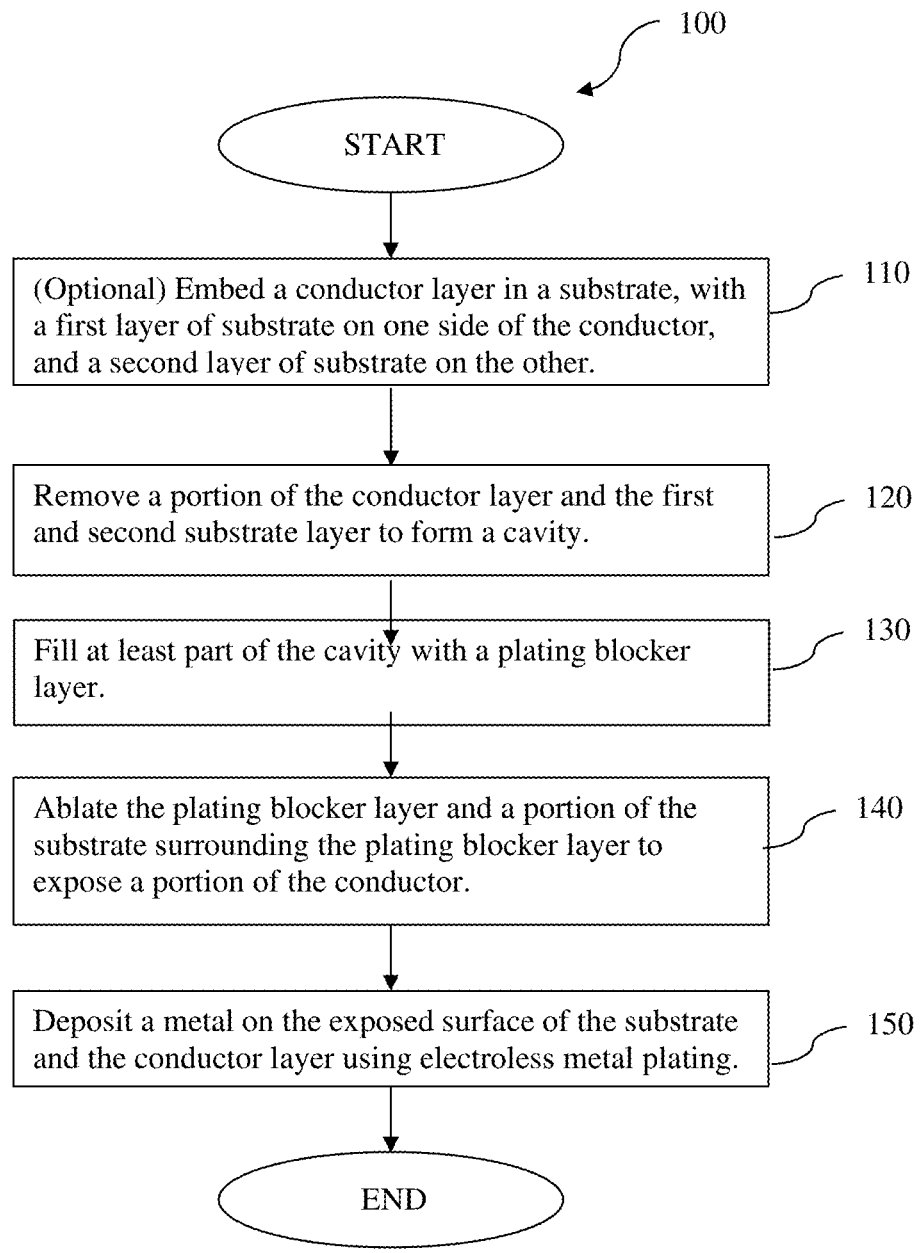
FIG. 1 illustrates a flowchart of one embodiment to show a method of separating an electrical circuit.

The present invention relates to methods, systems and devices for separating electrical circuit on a substrate. The principles and operations for such methods and systems, according to the present invention, may be better understood with reference to the accompanying description and drawings.

The present invention includes a method of separating electrical circuit using plating blocker. Electroless metal plating uses a redox reaction to deposit metal on an object without the passage of an electric current. One of the main advantages of electroless metal plating is that electroless plating allows electroless metal to be deposited evenly along edges, inside of holes, and over irregular shaped objects, which are difficult to plate evenly with electroplating with electric current. However, electroless metal plating is inhibited when surface is covered by the plating blocker.

Methods of forming an electrical circuit out of a substrate with first and second layers and a conductor positioned between the first and second layers are contemplated. A portion of the first layer, the conductor, and the second layer is removed to form a first cavity. A plating blocker material is deposited in the first cavity. A first portion of the plating blocker material and a portion of the first layer proximal to (e.g., next to, around, adjacent, etc) the plating blocker material is removed to form a second cavity. A surface of the second cavity is plated with a metal.

In some embodiments, the surface of the second cavity has a plating blocker surface and a non-plating blocker surface, such that the metal does not plate to the plating blocker surface. Preferably, the non-plating blocker surface includes at least a portion of the conductor and the first layer. It is preferred that the metal is plated to the non-plating blocker surface. In some embodiments, the surface of the second cavity has a plating blocker surface that separates a first non-plating blocker surface and a second non-plating blocker surface. Again, preferably the metal is plated to the first and second non-plating blocker surface, and preferably the metal is not plated to the plating blocker surface.

A second portion of the plating blocker material and a portion of the second layer proximal to the plating blocker material are removed to form a third cavity, in some embodiments. A surface of the third cavity is then plated with a metal. The surface of the second cavity preferably has a plating blocker surface and a non-plating blocker surface, and wherein the metal is plated to the non-plating blocker surface but does not plate to the plating blocker surface.

In some embodiments, at least a portion of the plated metal is removed, but it is also contemplated to remove a second portion of at least the first layer or the second layer proximal to the conductor. The first cavity typically forms at least one of a trench, a blind via, a through hole, or a combination thereof.

Circuit boards are also contemplated by the inventive subject matter. A first conductor is separated from a second conductor by a plating blocker material. The plating blocker material blocks chemical plating, typically by chemically deactivating a plating catalyst. Preferably at least one of the first conductor or the second conductor is electrically coupled to one or more of a plurality of conductor layers (e.g., electrical circuits or sub-circuits, etc). Likewise, typically at least one of the first conductor or the second conductor is positioned at least partially in a trench, a blind via, a buried via, or a through hole. In some embodiments, at least one of the first conductor or the second conductor is positioned on the plating blocker material.

It is contemplated that a first dielectric material and a second dielectric material can be further positioned on the plating blocker material, such that the first conductor is deposited (e.g., plated) on the first dielectric material and the second conductor is deposited (e.g., plated) on the second dielectric material. In preferred embodiments, the circuit board is a multilayer printed circuit board. While any conductive material is considered suitable, the first conductor is preferably selected from the group consisting of copper, nickel, tin, silver, gold, aluminum, lithium, palladium, platinum, rhodium, an alloy or combination thereof.

FIG. 1 illustrates an embodiment of method 100 for forming separate electrical circuits using a plating blocker material. In this embodiment, the method begins with optional step 110 of embedding a conductor layer in a substrate, with a first layer of substrate on one side of the conductor, and a second layer of substrate on the other. The conductor layer preferably includes at least one of palladium, platinum, silver, and gold, while the substrate can include polyimide, a cloth, a plastic, a dielectric, a ceramic, or a resin.

The method continues with step 120 of removing a portion of the conductor layer and the first and second substrate layer to form a cavity. The cavity or trench can be by use of UV, $CO_2$, YAG, excimer laser and mechanical trimmer or milling, or other appropriate means. The cavity or trench is then at least partially filled with a plating blocker layer, as in step 130. The plating blocker layer can be one of a photoimageable or non-photoimageable polymer film, wax, oligomer, or hardmask.

The method further includes step 140 of ablating part of the plating blocker layer and part of the substrate surrounding the plating blocker layer to form a cavity or trench exposing part of the conductor layer. The cavity or trench can be formed using UV, $CO_2$, YAG, excimer laser, mechanical trimmer, or other appropriate means. The method is then completed with step 150 of depositing a metal on the exposed surface of the substrate and the conductor layer using electroless metal plating. Since the plating blocker inhibits metal plating, the metal plates only on the exposed substrate and the exposed conductor layer, not on the plating blocker. The plated metal includes at least one of copper, nickel, tin, silver, gold, aluminum, lithium, palladium, platinum, rhodium, and corresponding alloys.

Figure 2:
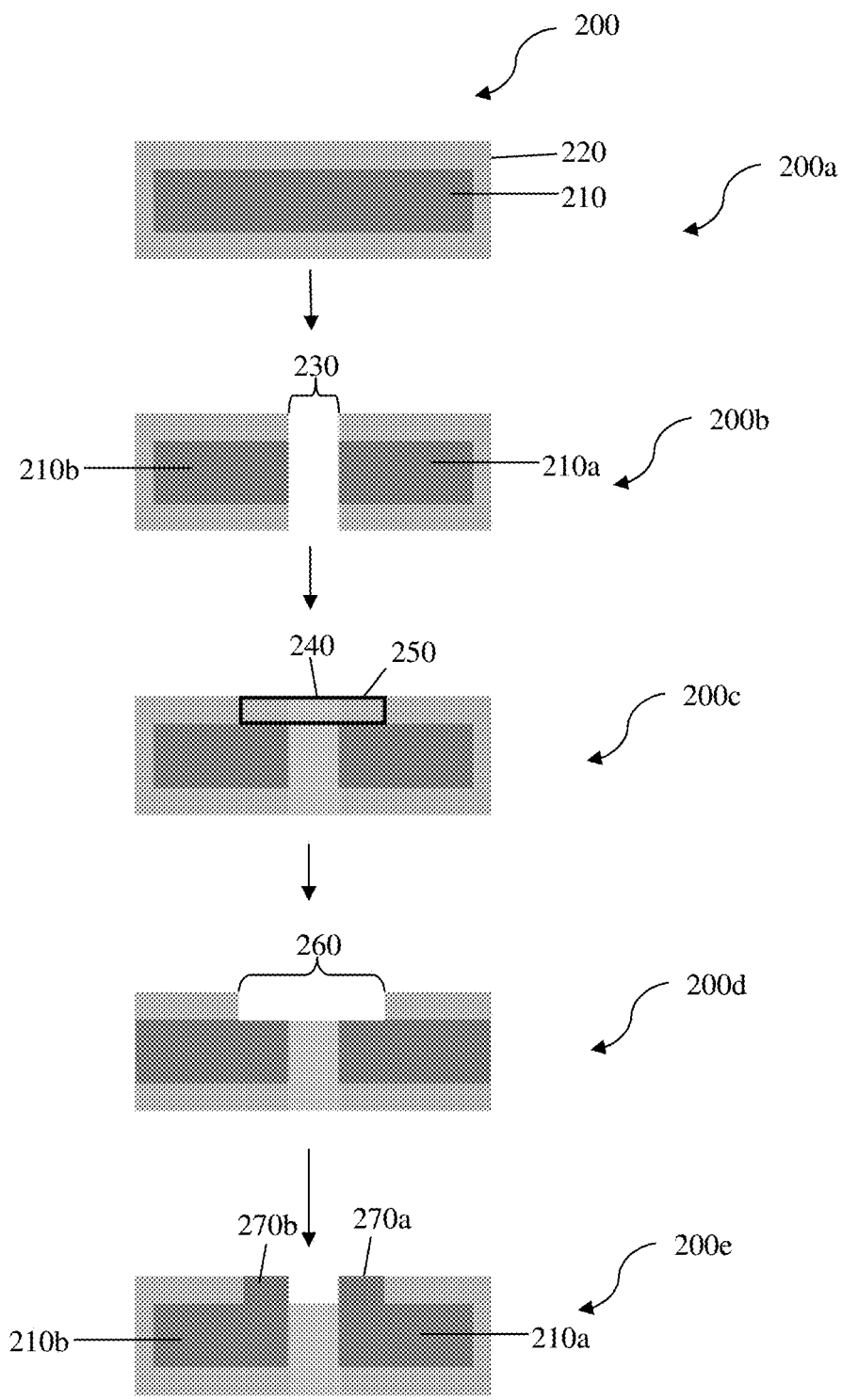
FIG. 2 illustrates a cross-sectional view of separating an electrical circuit corresponding to FIG. 1.

FIG. 2 illustrates a cross-sectional view of separating an electrical circuit in each step described in FIG. 1. All sides of conductor layer 210 are covered with substrate 220 at 200a. At least one of cavity 230 (e.g., trench, hole, etc) is applied on substrate 220 and conductor layer 210, yielding conductor layers 210a and 201b at 200b. Cavity 230 is then filled with plating blocker material 240 at 200c. Ablation is applied to remove portions of plating blocker material 240 and proximal substrate 250 surrounding the plating blocker 240 at 200d. Finally, electroless metal plating was applied to cavity 260 to plate the exposed surface of the substrate in cavity 260, as well as the exposed portions of conductor 210a and 210b with metal 270a and 270b, respectively.

Figure 3A:
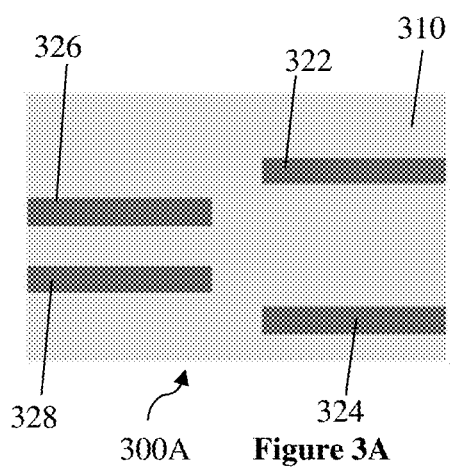
Figure 3B:
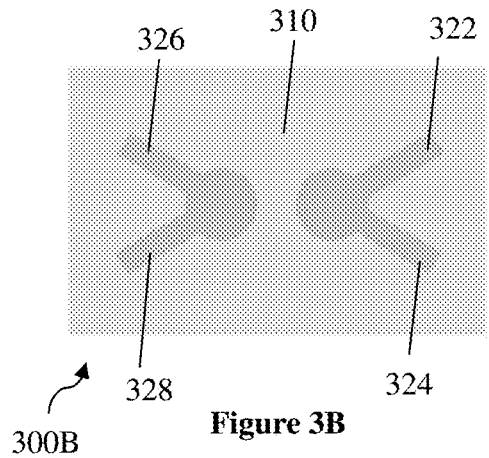
Figure 3C:
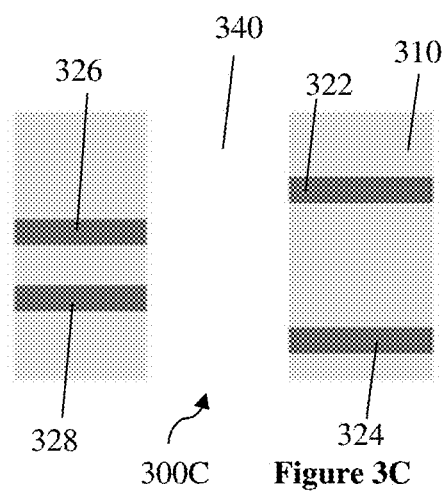
Figure 3D:
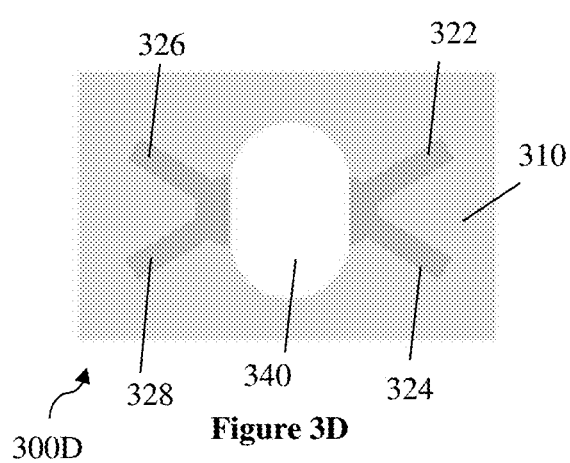
Figure 4A:
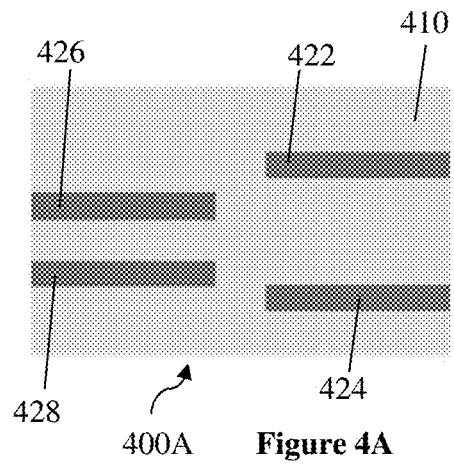
FIGS. 4A through 4J depict side cross sections and top down views of another electrical circuit of the inventive subject matter.
Figure 4B:
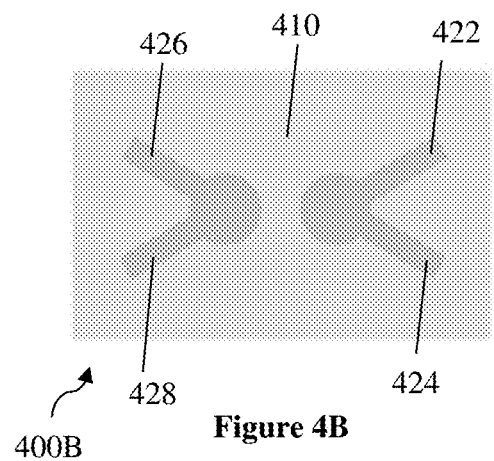
Figure 4C:
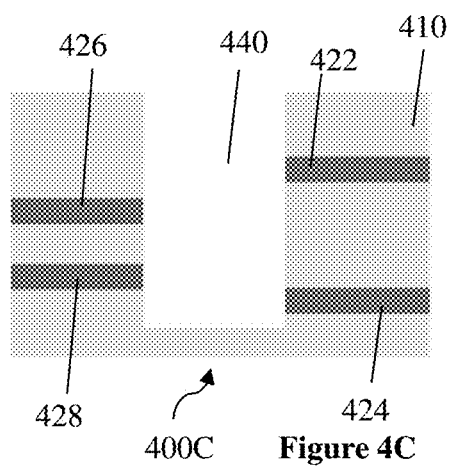
Figure 4D:
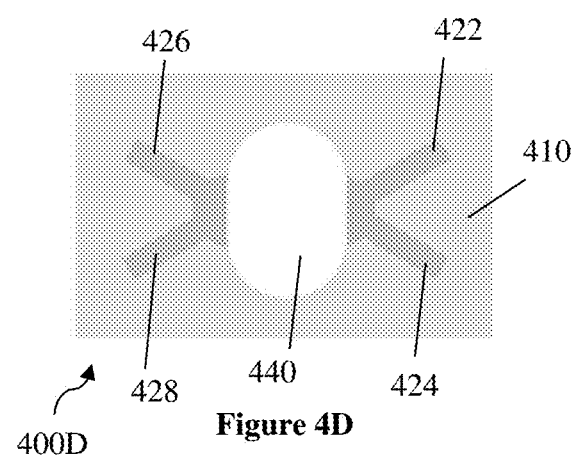
Figure 4E:
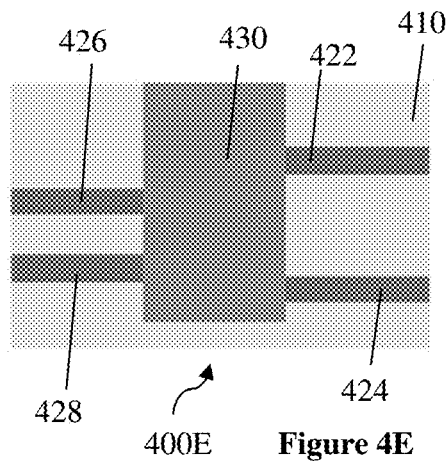
Figure 4F:
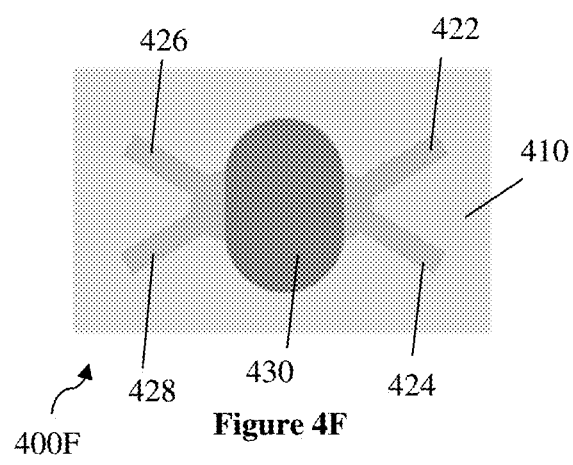
Figure 4G:
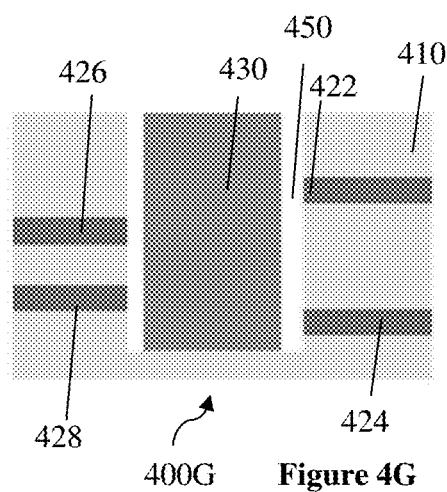
Figure 4H:
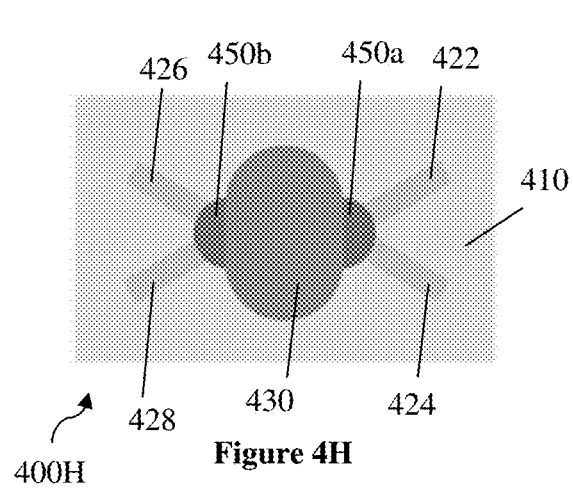
Figure 4I:
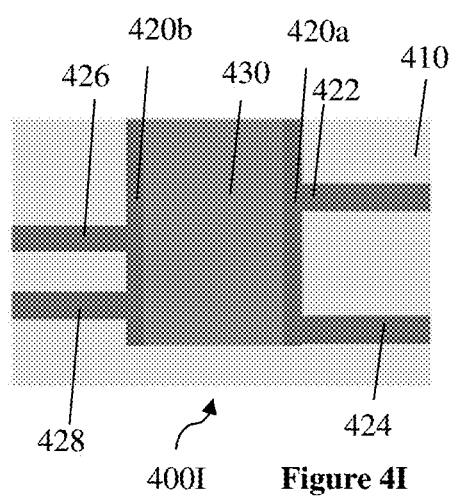
Figure 4J:
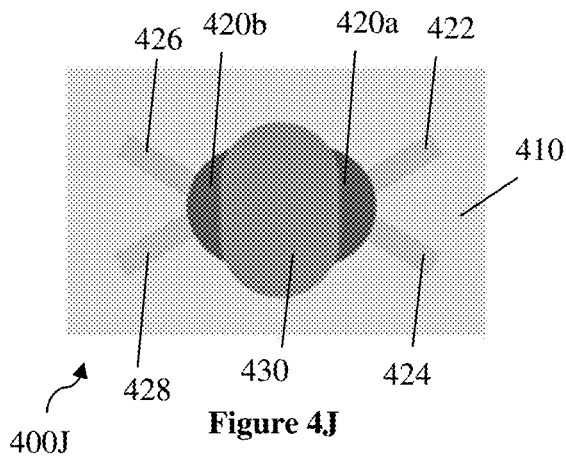

FIGS. 3A through 3J depict side cross sections and top down views of three dimensional circuits of the inventive subject matter. FIGS. 3A and 3B depict the first step in a process, with depictions 300A and 300B showing conductors 322, 324, 326, and 328 embedded in substrate 310. FIGS. 3C and 3D depict a second step in a process, with depictions 300C and 300D showing portions of substrate 310 and conductors 322, 324, 326, and 328 removed to create hole 340. FIGS. 3E and 3F depict a third step in a process, with depictions 300E and 300F showing portions hole 340 has been filled with blocker material (e.g., metal plating blocker) 330. FIGS. 3G and 3H depict a fourth step in a process, with depictions 300G and 300H showing portions of substrate 310, conductors 322, 324, 326, and 328, and blocker material 330 removed to form hole 350.

FIGS. 3I and 3J show a sample product of processes of the inventive subject matter, with depiction 300I showing conductors 320*a* and 320*b* have been plated to surfaces of substrate 310 and conductors 322, 324, 326, and 328 that are not covered with blocker material 330. As such, conductors 320*a* and 320*b* are separated from each other by plating blocker layer 330. Conductor 320*a* is electrically coupled to conductors 322 and 324, each of which is present in a separate layer of substrate 310. Likewise, conductor 320*b* is electrically coupled to conductors 326 and 328, each of which is present in a separate layer of substrate 310. It should be appreciated that each of conductors 322, 324, 326, and 328 are each in a separate layer or level of substrate 310. Depiction 300J makes clear the separation of conductors 320*a* and 320*b* via blocker material 330*a* and 330*b*. Depiction 300J further makes clear that hole 340 exists between plating blocker material 330*a* and 330*b* as well as conductors 320*a* and 320*b*. Depiction 300B also makes clear that, not only are conductors 322, 324, 326, and 328 each in a separate layer of substrate 310, they are also relatively non-overlapping or oriented in different directions.

FIGS. 4A through 4J depict side cross sections and top down views of three dimensional circuits of the inventive subject matter that are similar to those depicted in FIGS. 3A through 3J, with similarly numbered elements described the same. The primary difference between the process steps and embodiments of the inventive subject matter in FIGS. 4A through 4J, is that in the embodiments of FIGS. 4A through 4J, neither the hole 440 nor the hole for 450 are through holes, in that each has a bottom in substrate 410.

FIGS. 5A through 5J depict side cross sections and top down views of three dimensional circuits of the inventive subject matter. FIGS. 5A and 5B depict the first step in a process, with depictions 500A and 500B showing conductors 520, 522, and 524 embedded in blocker material 530 on substrate 510*a*, and substrate 510*b*. View 500B makes it clear that conductors 520, 522, and 524 are each actually two sets of conductors, 520*a* and 520*b*, 522*a* and 522*b*, and 524*a* and 524*b*, respectively, that are separated by block material 530. FIGS. 5C and 5D depict the next step in a process, with depictions 500C and 500D showing substrates 510*a* and 510*b* have been joined to form substrate 510, which further embeds block material 530 in the substrate. View 500D makes it clear that conductors 520*a* and 520*b*, 522*a* and 522*b*, and 524*a* and 524*b* each are positioned over a portion of block material 530.

FIGS. 5E and 5F depict the next step in a process, with depictions 500E and 500F showing a portion of substrate 510 that covered block material 530 and conductors 520*a* and 520*b*, 522*a* and 522*b*, and 524*a* and 524*b* has been removed to form hole 550, thereby exposing portions of block material 530 and conductors 520*a* and 520*b*, 522*a* and 522*b*, and 524*a* and 524*b*. FIGS. 5G and 5H depict the next step in a process, with depictions 500G and 500H showing conductor 560 has been plated to the exposed walls of hole 550 and the exposed portions of conductors 520*a* and 520*b*, 522*a* and 522*b*, and 524*a* and 524*b*. FIGS. 5I and 5J depict the next step in a process, with depictions 500I and 500J showing four portions of conductor 560 have been removed (e.g., via milling, etc) leaving holes 572, 574, 576, and 578. It should be noted that holes 572, 574, 576, and 578 now separate each of conductors 520*a* and 520*b*, 522*a* and 522*b*, and 524*a* and 524*b* from each other.

Figure 6A:
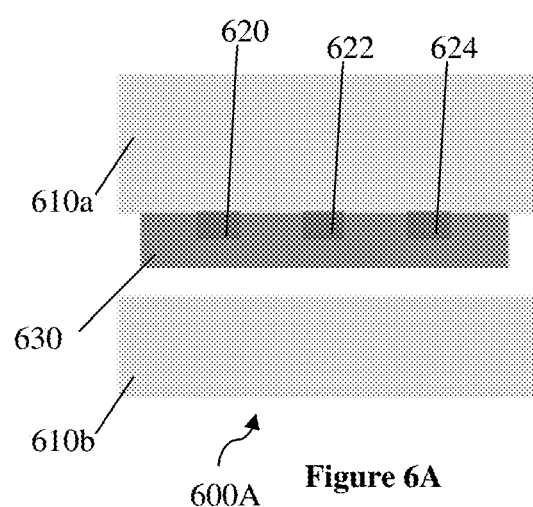
FIGS. 6A through 6J depict side cross sections and top down views of still another electrical circuit of the inventive subject matter.
Figure 6B:
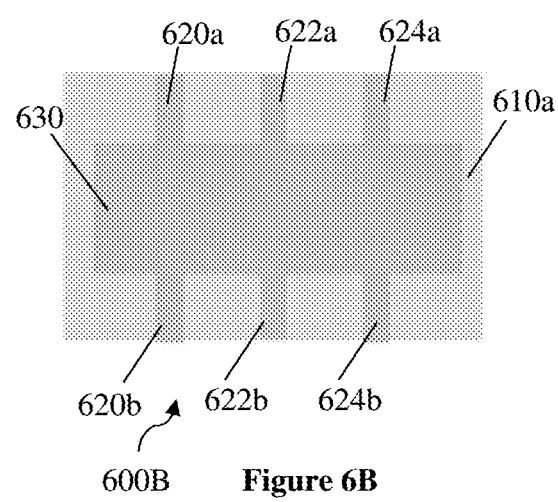
Figure 6C:
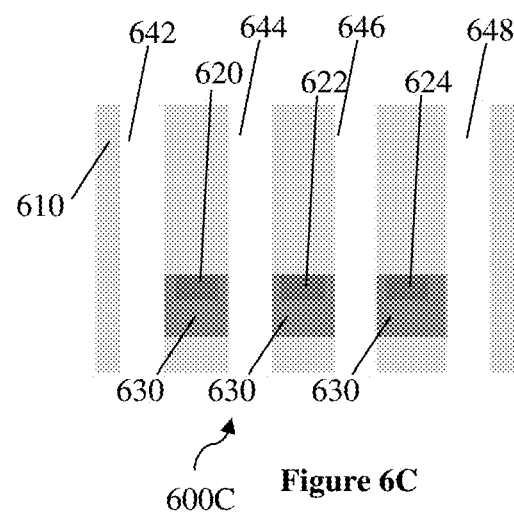
Figure 6D:
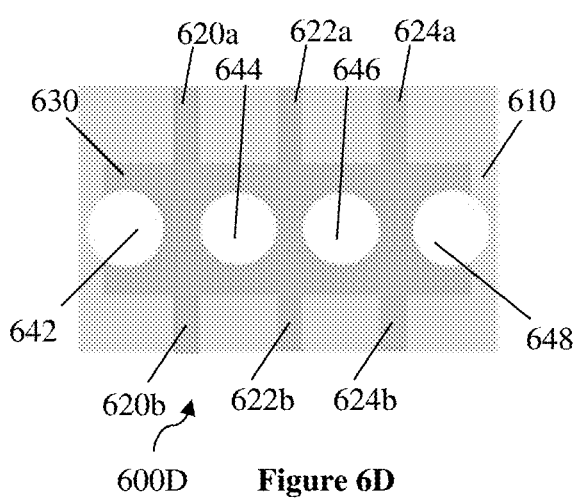
Figure 6E:
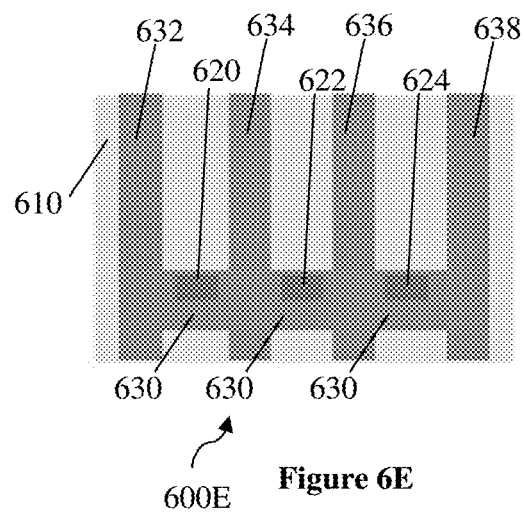
Figure 6F:
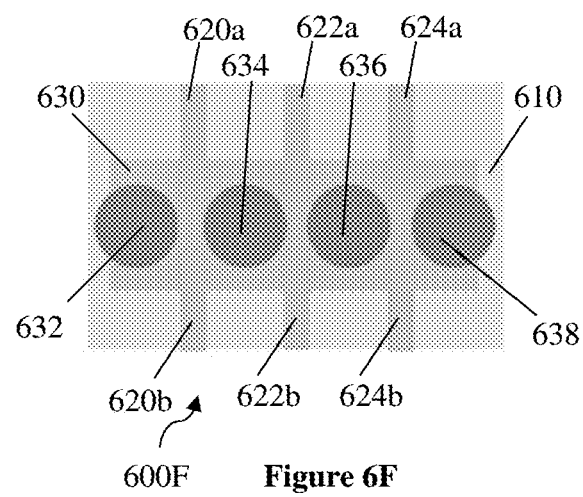

FIGS. 6A through 6J depict side cross sections and top down views of three dimensional circuits of the inventive subject matter. FIGS. 6A and 6B depict the first step in a process similar to FIGS. 5A and 5D, with like numbered elements described the same. FIGS. 6C and 6D depict the next step in a process, with depictions 600C and 600D showing that substrates 610*a* and 610*b* have been joined to embed block material 630 and conductors 620, 622, and 624 (conductor pairs 620*a* and 620*b*, 622*a* and 622*b*, and 624*a* and 624*b* in view 600D). Portions of block material 630 and substrate 610 have been removed, yielding through holes 642, 644, 646, and 648. FIGS. 6E and 6F depict the next step in a process, with depictions 600E and 600F showing additional block material 632, 634, 636, and 638 have been added to through holes 642, 644, 646, and 648, respectively.

Figure 6G:
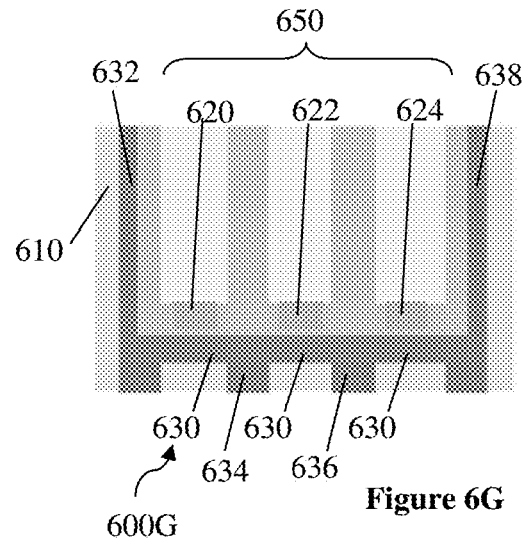
Figure 6H:
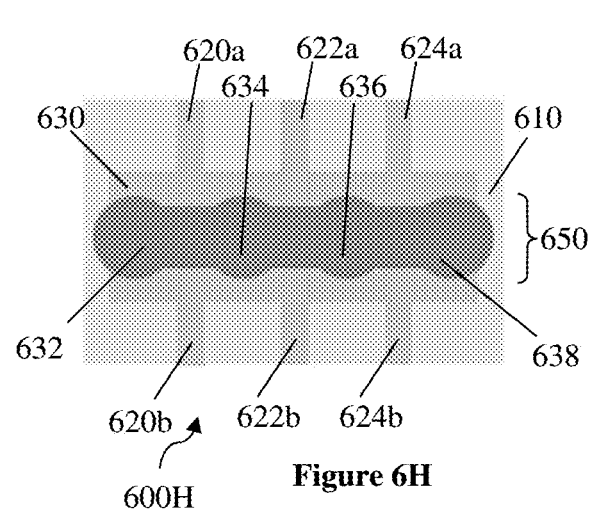
Figure 6I:
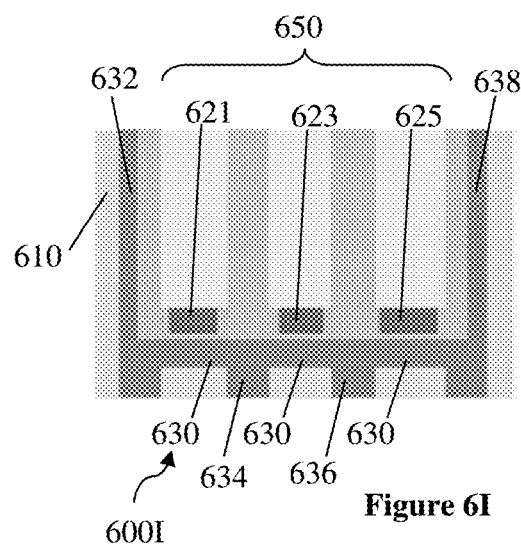
Figure 6J:
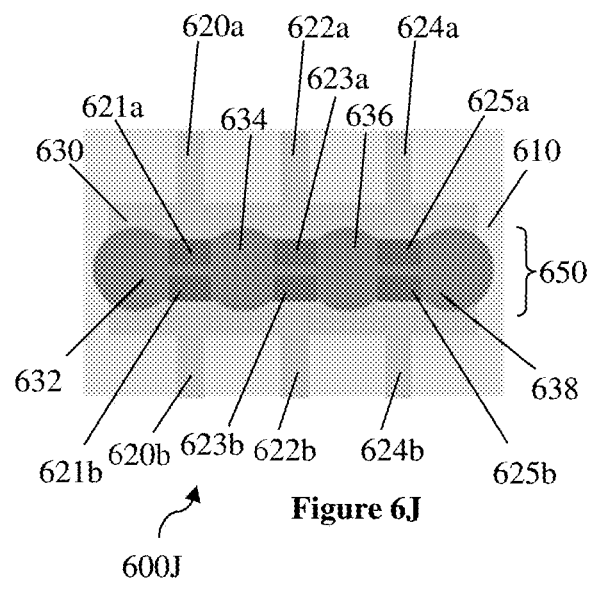

FIGS. 6G and 6H depict the next step in a process, with depictions 600G and 600H showing portions of substrate 610, conductors 620, 622, and 624 (conductor pairs 620*a* and 620*b*, 622*a* and 622*b*, and 624*a* and 624*b* in view 600H), and block material 630, 632, 634, 636, and 638 have been removed to form trough 650, exposing portions of conductors 620, 622, and 624 (conductor pairs 620*a* and 620*b*, 622*a* and 622*b*, and 624*a* and 624*b* in view 600H). FIGS. 6I and 6J depict the next step in a process, with depictions 600I and 600J showing conductors 621, 623, and 625 (conductor pairs 621*a* and 621*b*, 623*a* and 623*b*, and 625*a* and 625*b* in view 600J) have been deposited (e.g., electroless plating) to the exposed surfaces of conductors 620, 622, and 624 (conductor pairs 620*a* and 620*b*, 622*a* and 622*b*, and 624*a* and 624*b* in view 600J).

Figure 7A:
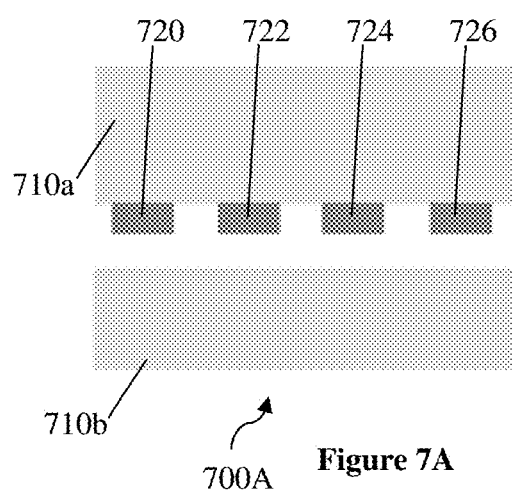
FIGS. 7A through 7J depict side cross sections and top down views of yet another electrical circuit of the inventive subject matter.
Figure 7B:
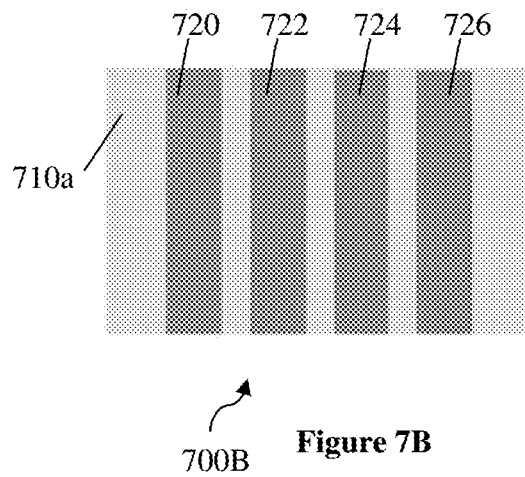
Figure 7C:
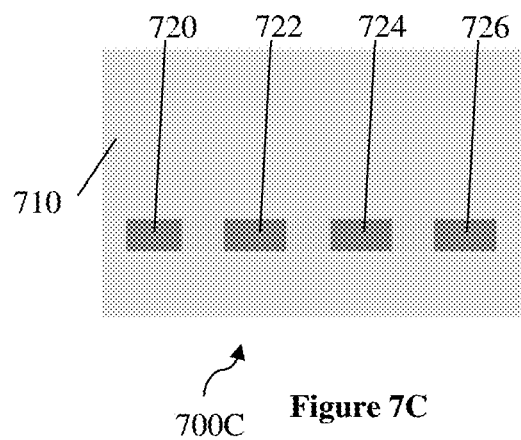
Figure 7D:
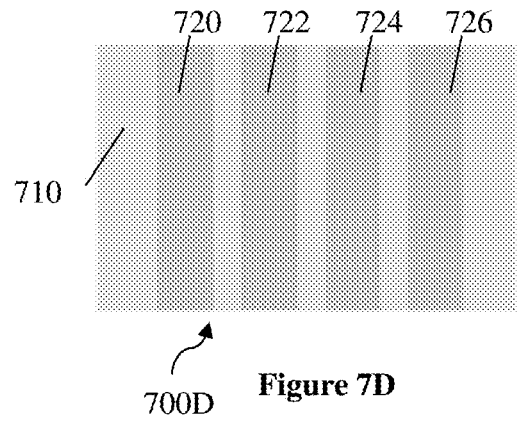
Figure 7E:
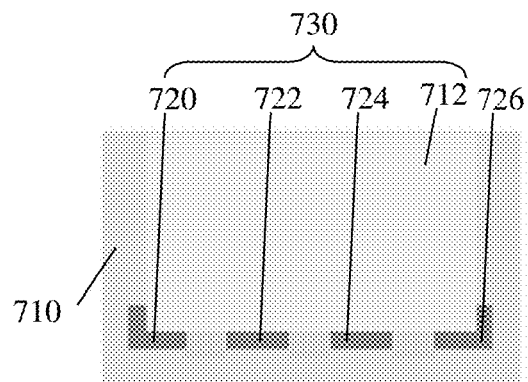
Figure 7F:
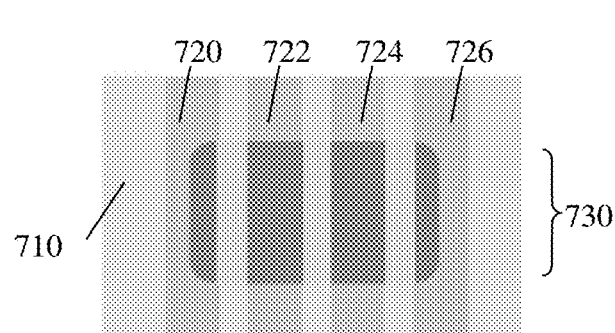

FIGS. 7A through 7J depict side cross sections and top down views of three dimensional circuits of the inventive subject matter. FIGS. 7A and 7B depict the first step in a process, with depictions 700A and 700B showing block material 720, 722, 724, and 726 positioned as rows along substrate 710*a*. FIGS. 7C and 7D depict the next step in a process, with depictions 700C and 700D showing substrate 710*a* and 710*b* are joined to form substrate 710, with block material 720, 722, 724, and 726 embedded within substrate 710. FIGS. 7E and 7F depict the next step in a process, with depictions 700E and 700F showing portions of substrate 710 and block material 720, 722, 724, and 726 have been removed (e.g., milling), forming trough 730 and exposing surfaces of block material 720, 722, 724, and 726 as well as substrate surface 712 about trough 730.

Figure 7G:
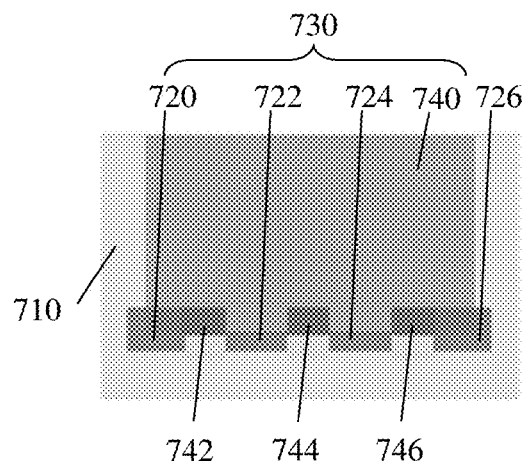
Figure 7H:
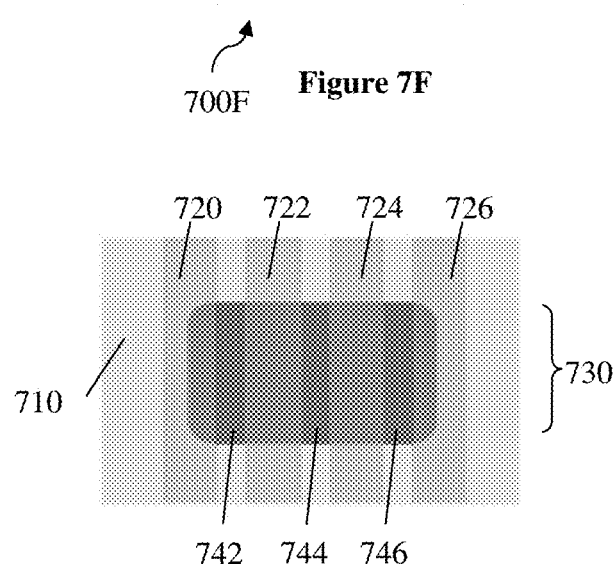
Figure 7I:
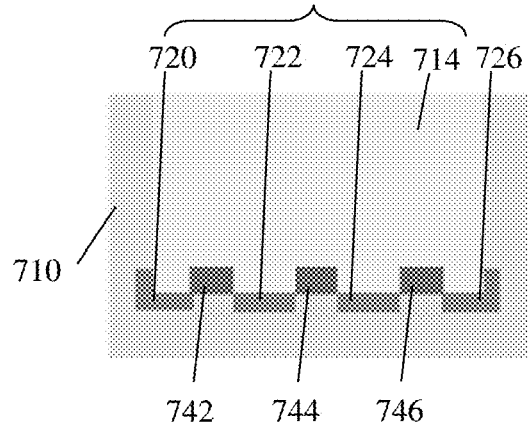
Figure 7J:
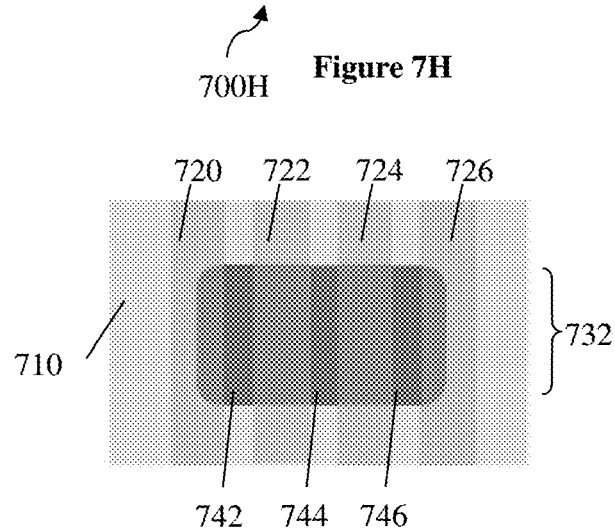

FIGS. 7G and 7H depict the next step in a process, with depictions 700G and 700H showing conductor 740 has been deposited (e.g., electroless plating) to substrate surface 712 as well as other exposed substrate surface as conductor rows 742, 744, and 746. FIGS. 7I and 7J depict the next step in a process, with depictions 700I and 700J showing conductor 740 has been removed from parts of substrate surface 710 (e.g., milling), optionally some additional portions of substrate 710, forming trough 732.

Figure 8A:
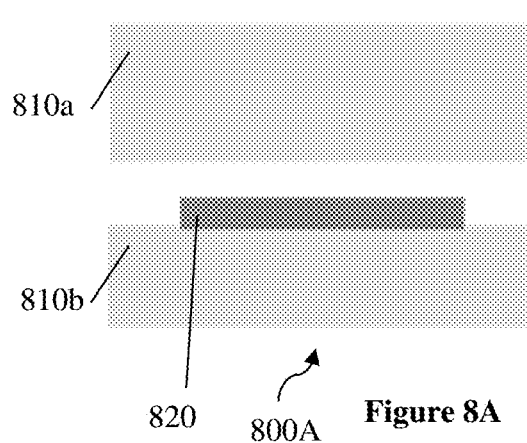
FIGS. 8A through 8J depict side cross sections and top down views of still another electrical circuit of the inventive subject matter.
Figure 8B:
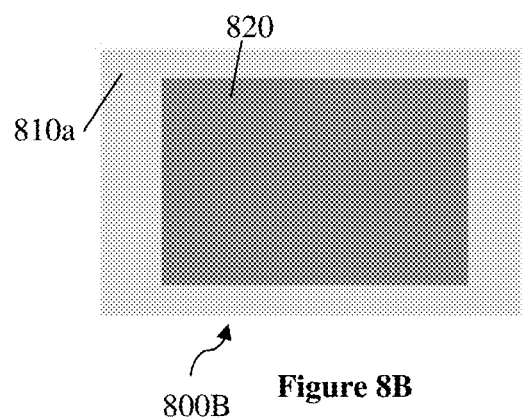
Figure 8C:
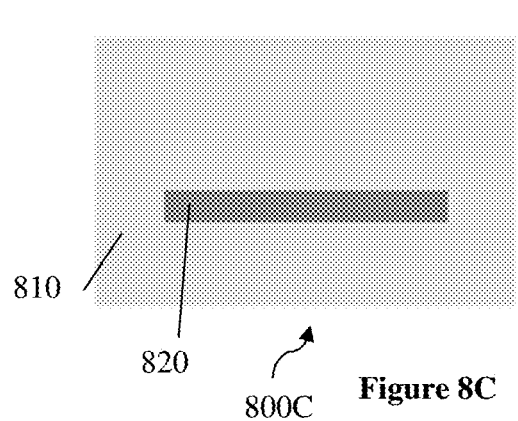
Figure 8D:
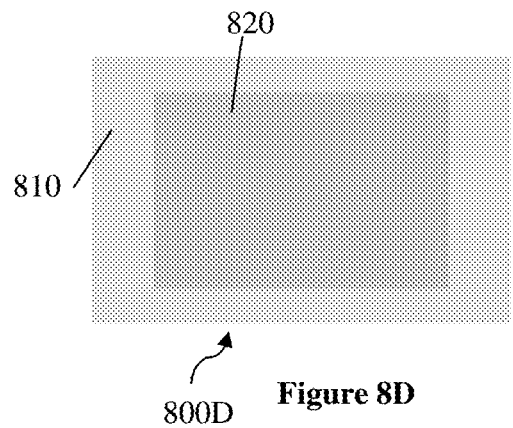
Figure 8E:
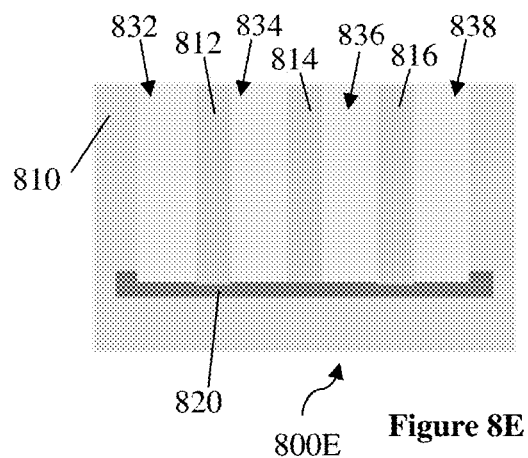
Figure 8F:
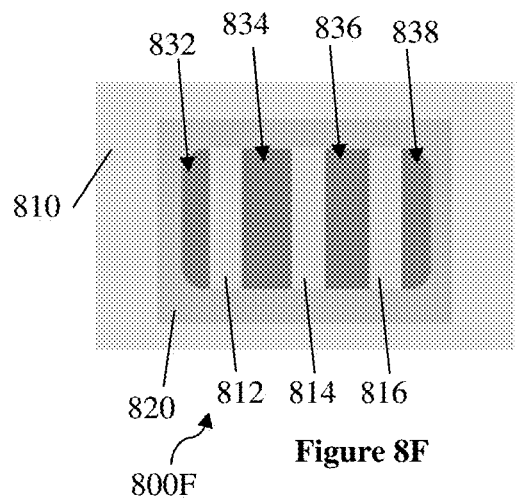

FIGS. 8A through 8J depict side cross sections and top down views of three dimensional circuits of the inventive subject matter. FIGS. 8A and 8B depict the first step in a process, with depictions 800A and 800B showing block material 820 positioned on substrate 810*b*. FIGS. 8C and 8D depict the next step in a process, with depictions 800C and 800D showing substrates 810*a* and 810*b* have been joined to form substrate 810, embedding block material 820 within substrate 810. FIGS. 8E and 8F depict the next step in a process, with depictions 800E and 800F showing four portions of substrate 810 have been removed, forming troughs 832, 834, 836, and 838, exposing portions of block material 820 as well as surfaces of substrate 810 in each trough. Portions of substrate 810 remain as columns on the surface of block material 820, namely columns 812, 814, and 816.

Figure 8G:
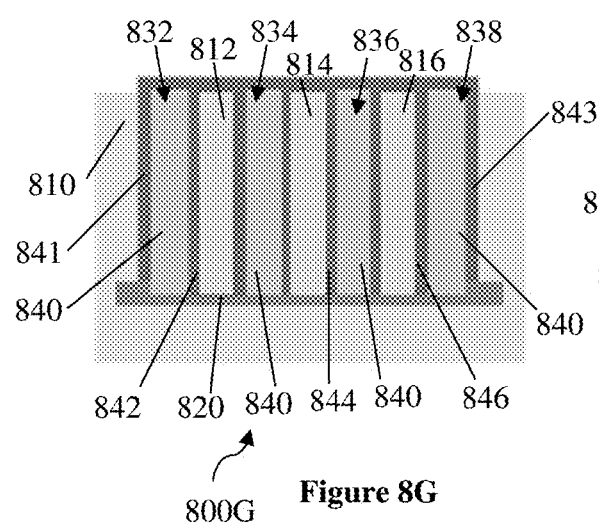
Figure 8H:
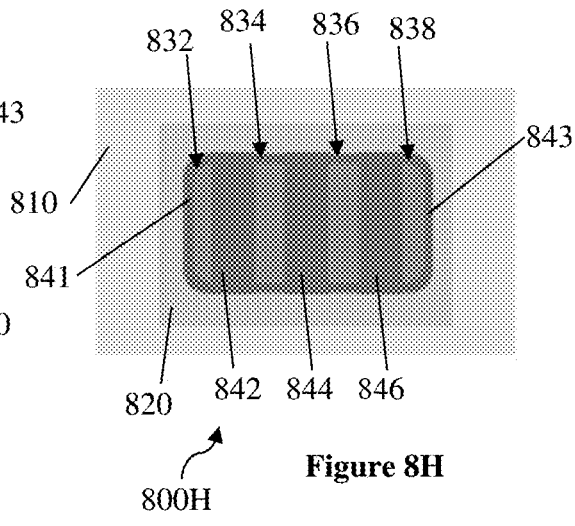
Figure 8I:
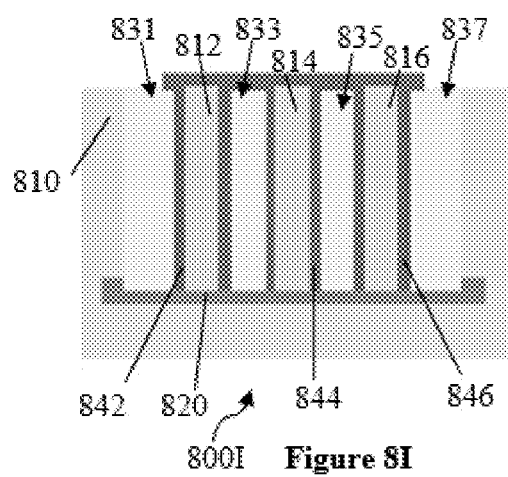
Figure 8J:
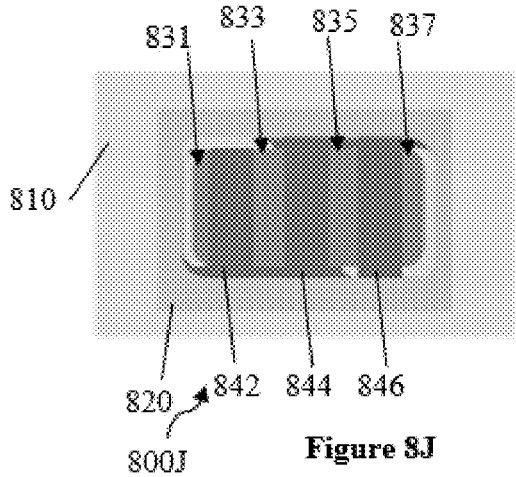

FIGS. 8G and 8H depict the next step in a process, with depictions 800G and 800H showing conductor 840 has been deposited (e.g., electroless plating) onto the exposed surfaces of substrate 810 in each of troughs 832, 834, 836, and 838, for example conductors 841 and 843, as well as to the surfaces of columns 812, 814, and 816, as conductors 842, 844, and 846, respectively. FIGS. 8I and 8J depict the next step in a process, with depictions 800I and 800J showing portions of conductor 840 removed from substrate surfaces, for example conductors 841 and 843, forming troughs 831, 833, 835, and 837. Troughs 831, 833, 835, and 837 were formed such that conductors 842, 844, and 846 remain intact on the surfaces of columns 812, 814, and 816, respectively.

The following discussion provides many example embodiments of the inventive subject matter. Although each embodiment represents a single combination of inventive elements, the inventive subject matter is considered to include all possible combinations of the disclosed elements. Thus if one embodiment comprises elements A, B, and C, and a second embodiment comprises elements B and D, then the inventive subject matter is also considered to include other remaining combinations of A, B, C, or D, even if not explicitly disclosed.

As used herein, and unless the context dictates otherwise, the term "coupled to" is intended to include both direct coupling (in which two elements that are coupled to each other contact each other) and indirect coupling (in which at least one additional element is located between the two elements). Therefore, the terms "coupled to" and "coupled with" are used synonymously.

In some embodiments, the numbers expressing quantities of ingredients, properties such as concentration, reaction conditions, and so forth, used to describe and claim certain embodiments of the invention are to be understood as being modified in some instances by the term "about." Accordingly, in some embodiments, the numerical parameters set forth in the written description and attached claims are approximations that can vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the invention are approximations, the numerical values set forth in the specific examples are reported as precisely as practicable. The numerical values presented in some embodiments of the invention may contain certain errors necessarily resulting from the standard deviation found in their respective testing measurements.

Unless the context dictates the contrary, all ranges set forth herein should be interpreted as being inclusive of their endpoints, and open-ended ranges should be interpreted to include only commercially practical values. Similarly, all lists of values should be considered as inclusive of intermediate values unless the context indicates the contrary.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

All methods described herein can be performed in any suitable order unless otherwise indicated herein or otherwise clearly contradicted by context. The use of any and all examples, or exemplary language (e.g. "such as") provided with respect to certain embodiments herein is intended merely to better illuminate the invention and does not pose a limitation on the scope of the invention otherwise claimed. No language in the specification should be construed as indicating any non-claimed element essential to the practice of the invention.

Groupings of alternative elements or embodiments of the invention disclosed herein are not to be construed as limitations. Each group member can be referred to and claimed individually or in any combination with other members of the group or other elements found herein. One or more members of a group can be included in, or deleted from, a group for reasons of convenience and/or patentability. When any such inclusion or deletion occurs, the specification is herein deemed to contain the group as modified thus fulfilling the written description of all Markush groups used in the appended claims.

It should be apparent to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Where the specification claims refers to at least one of something selected from the group consisting of A, B, C . . . and N, the text should be interpreted as requiring only one element from the group, not A plus N, or B plus N, etc.

What is claimed is:

1. A method of forming an electrical circuit out of a substrate having a first and a second layer with a conductor positioned between the first and second layers, comprising:
   removing a portion of the first layer, the conductor, and the second layer to form a first cavity;
   depositing a blocker material in the first cavity;
   removing a first portion of the blocker material and only a portion of the first layer proximal to the first portion of the blocker material to form a second cavity; and
   plating a surface of the second cavity with a metal.

2. The method of claim 1, wherein the surface of the second cavity comprises a blocker surface and a non-blocker surface, and wherein the metal does not plate to the blocker surface.

3. The method of claim 2, wherein the non-blocker surface comprises a portion of the conductor and the first layer.

4. The method of claim 2, wherein the metal plates to the non-blocker surface.

5. The method of claim 1, wherein a portion of the surface of the second cavity comprises a blocker surface separating a first non-blocker surface of the second cavity from a second non-blocker surface of the second cavity.

6. The method of claim 5, wherein the metal plates to the first and second non-blocker surface.

7. The method of claim 1, further comprising:
   removing a second portion of the blocker material and a portion of the second layer proximal to the blocker material to form a third cavity; and
   plating a surface of the third cavity with a metal.

8. The method of claim 7, wherein the surface of the second cavity comprises a blocker surface and a non-blocker surface, and wherein the metal plates to the non-blocker surface but not the blocker surface.

9. The method of claim 1, further comprising removing at least a portion of the plated metal.

10. The method of claim 1, further comprising removing a portion of the second layer proximal to the conductor.

11. The method of claim 1, wherein the first cavity forms at least one of a trench, a blind via, or a through hole.

12. The method of claim 1, wherein the blocker material is a metal plating blocker.

13. The method of claim 1, further comprising the step of removing a second portion of the blocker material and a further portion of the first layer proximal to the second portion of the blocker material to form a third cavity, wherein the third cavity is separated from the second cavity by the blocker material.

14. The method of claim 1, wherein the step forming the second cavity further comprises removing a portion of the second layer proximal to the first portion of the blocker material, and wherein the plated surface of the second cavity comprises a surface of the first layer and the second layer.

* * * * *